United States Patent [19]

Hiwada et al.

[11] Patent Number: 5,016,226
[45] Date of Patent: May 14, 1991

[54] APPARATUS FOR GENERATING A DATA STREAM

[75] Inventors: Kiyokasu Hiwada, Akishimashi; Nobuyuki Kasuga, Hachiojishi, both of Japan

[73] Assignee: Hewlett-Packard, Palo Alto, Calif.

[21] Appl. No.: 269,386

[22] Filed: Nov. 9, 1988

[30] Foreign Application Priority Data

Nov. 16, 1986 [JP] Japan .............................. 62-290263

[51] Int. Cl.$^5$ .......................... G11C 7/00; G11C 8/00; G11C 11/402
[52] U.S. Cl. .............................. 365/233; 365/230.03; 365/189.05; 365/230.08
[58] Field of Search ...................... 365/230.03, 230.04, 365/233, 189.05, 230.02, 189.02, 230.06, 236, 230.08, 230.09

[56] References Cited

U.S. PATENT DOCUMENTS

| | | | |
|---|---|---|---|
| 4,611,299 | 9/1986 | Hori et al. | 365/230.04 X |
| 4,800,530 | 1/1989 | Itoh et al. | 365/233 X |
| 4,802,132 | 1/1989 | Ohsawa | 365/230.03 |
| 4,807,191 | 2/1989 | Flannagan | 365/230.03 |

*Primary Examiner*—Alyssa H. Bowler

[57] ABSTRACT

In one embodiment of the invention, the selection of the number of the latches from which data is read can be changed dynamically during the generation of the data stream. The scanning of the latches can be stopped temporarily while the next set of data from the memory is stored in the latches, then resumed. For example, assume that n+1 number of banks are provided in the memory and that the selection of the number of the latches can be changed dynamically between n and n+1. Then, the possible length/period, N, of the data stream that can be generated would be:

$$N = i^*n + j^*(n+1)$$

where i and j are non-negative integers, and one of i or j is non-zero.

In another embodiment of the present invention, the memory has m+n banks, and the latch group has m+n latches. The number of the latches from which data is read during each scanning cycle can be selected from the range n, n+1, ..., n+m−1, n+m. Consequently, any data stream having a length or period which is a multiple of any of n, n+1, ..., n+m−1, n+m can be generated.

10 Claims, 6 Drawing Sheets

APPARATUS FOR GENERATING A DATA STREAM

FIELD OF THE INVENTION

The present invention relates to a data stream generator, such as a word generator or a clock pulse generator, which can generate a data stream at a high speed.

BACKGROUND OF THE INVENTION

In a digital device, such as a word generator, which generates a data stream at a high speed, the desired data stream is obtained by writing the data stream to be generated in a memory and then reading it out in synchronism with a clock. One example of such a data stream generator known in the prior art, especially its memory and the peripheral portion, is shown in FIG. 3.

In the configuration in FIG. 3, the start address is first set to an address counter 31, and then a clock $f_{CLK}$ is supplied thereto. Then, the address counter 31 provides the memory 33 with a sequence of the successive addresses starting at the start address in synchronism with the clock $f_{CLK}$, and the data read therefrom is temporarily latched in a latch 35 in synchronism with the clock $f_{CLK}$. This allows the desired data stream which has been written in advance in the memory 33 between the start and last addresses shown in FIG. 3 to be provided to the latch 35.

The last address is set to an address comparator 37. The addresses generated by the address counter 31 are also provided to the address comparator 37. When the address generated by the address counter 31 coincides with the last address, operation stops. Alternatively, different operations may be taken when the addresses coincide such as resetting the counter to the start address for repeating the same operation, or stopping this repetition when the count of the additional counter which counts the number of the repetition reaches the number of the preset cycle. Though there are a variety of options in the manner as to how the data stream is repeated as explained above, it is in any way difficult to generate the data stream at a high speed with a configuration as shown in FIG. 3 due to the limiting factor of the reading speed of the memory 33.

In order to solve this problem, the prior art employs the configuration shown in FIG. 4, with a memory divided into n banks arranged in parallel, to generate the data stream at a speed higher than that of the memory.

Specifically, in the configuration shown in FIG. 4, the structures of an address comparator 47 and an address counter 41 are essentially the same as their counterparts shown in FIG. 3. In this configuration, a 1/n-frequency divider 401 provides the address counter 41 with the frequency-divided clock signal $f_{CLK}/n$. The address output by the address counter 41 is provided to a memory 43 consisting of n banks, bank 1 through bank n, arranged in parallel. Each of banks 1 through n sets the result of reading from the given address into the associated one of latches 1 through n. An n-counter 405 receives the clock $f_{CLK}$, and the count output of the counter 405 is provided to the selection signal input of a multiplexer 403. This causes a multiplexer 403 to sequentially select the data stored in the latches 1 through n and output the selected data. With such a structure and control, the data stream can be generated at a speed n times as fast as that of the memory.

However, the conventional configuration shown in FIG. 4 has the serious problem that the length or the period of the data stream that can be generated is limited to a multiple of n. That is, in this configuration, blocks of n pieces of data are simultaneously read from the memory 43, and the multiplexer 403 sequentially selects the latches from the latch group 45 containing the n pieces of data to output. A larger n increases the speed of the data stream generation, but also increases the constraints on the possible lengths or periods of data streams.

One conventional method for solving this problem is to make the length of the data stream a multiple of n by adding extra meaningless data in case the length or period of the data is not a multiple of n. However, there are some cases in which the addition of the extra data may not always be possible. If repeating data is to be generated, other methods can be employed such as storing between the start and last addresses the data having the length of the common multiple between n and the period of the data stream, p. This method has the drawback of wasting the memory because a plurality of periods is required to be written in the memory. Neither method is easy to implement, and the limitation of multiples of n remains a serious problem.

SUMMARY OF THE INVENTION

A primary object of the invention is to solve the problems of the prior art described above and to relax the limitation on the length/period of the data stream i.e., multiples of n.

In contrast to the prior art in which scanning is made across all the latches of the latch group in which plurality of pieces of data have been read from a memory and held for output, one embodiment of the present invention may limit the access only to a selected part of these latches.

In one embodiment of the invention, the selection of the number of the latches from which data is read can be changed dynamically during the generation of the data stream. The scanning of the latches can be stopped temporarily while the next set of data from the memory is stored in the latches, then resumed. For example, assume that n+1 number of banks are provided in the memory and that the selection of the number of the latches can be changed dynamically between n and n+1. Then, the possible length/period, N, of the data stream that can be generated would be:

$$N = i*n + j*(n+1)$$

where i and j are non-negative integers, and one of i or j is non-zero.

In another embodiment of the present invention, the memory has m+n banks, and the latch group has m+n latches. The number of the latches from which data is read during each scanning cycle can be selected from the range n, n+1, ..., n+m−1, n+m. Consequently, any data stream having a length or period which is a multiple of any of n, n+1, ..., n+m−1, n+m can be generated, as opposed to the multiples of n of the prior art.

DETAILED DESCRIPTION OF THE PREFERRED EMBODIMENTS OF THE INVENTION

Figure 1:
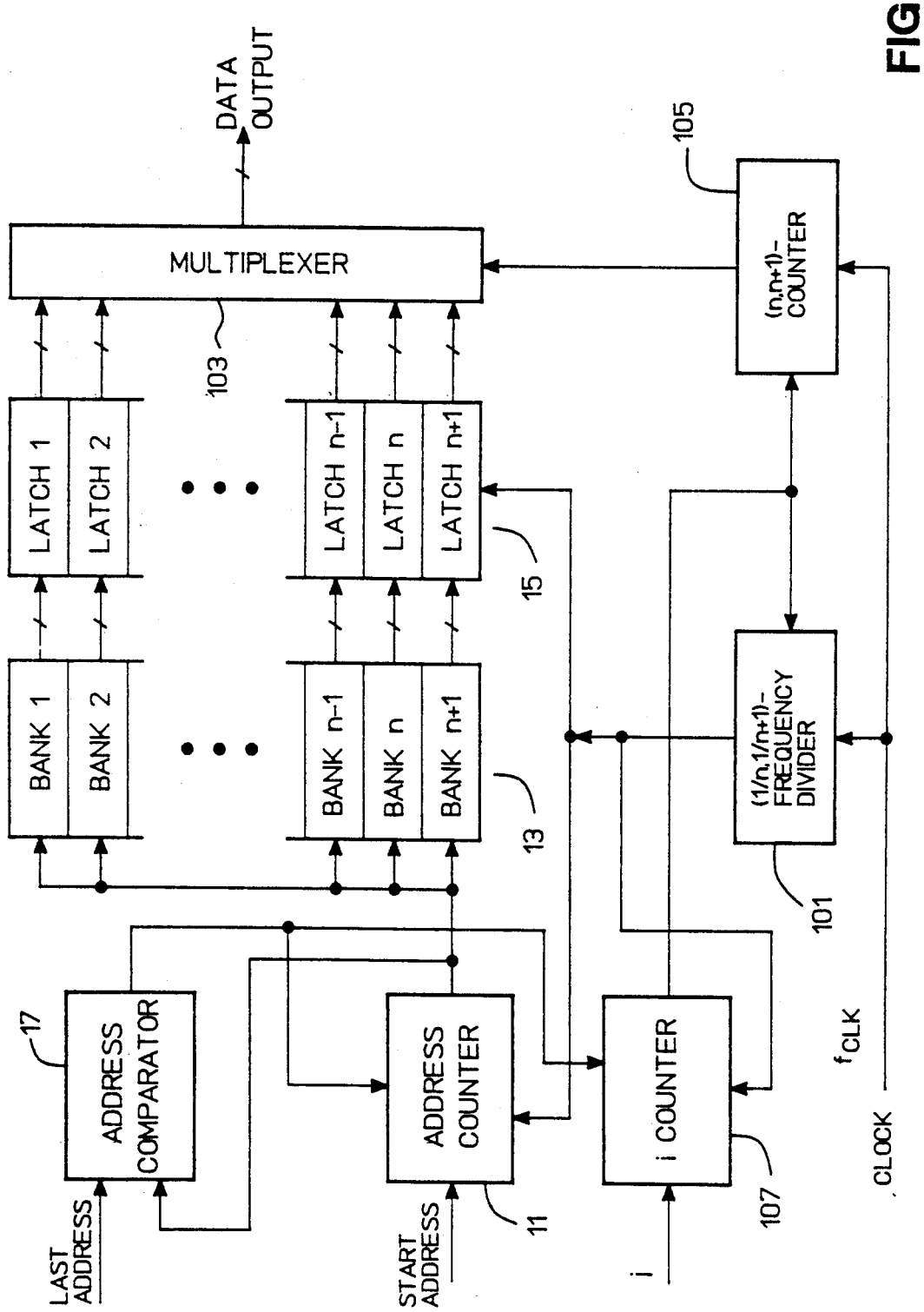
FIG. 1 shows the block diagram of one embodiment of the present invention.

FIG. 1 is a block diagram of the first embodiment of the present invention.

In FIG. 1, an address comparator 17 and an address counter 11 operate in the same manner as their counterparts described above in connection with the device shown in FIG. 4. A memory group 13 has n+1 banks. A dual modulus (1/n, 1/n+1)-frequency divider 101 which supplies count signals to the address counter 11 can switch its factor of frequency-division between n and n+1 at any time. A dual modulus (n, n+1)-counter 105 that sends a selection signal to a multiplexer 103 can also switch its modulus number between n and n+1 at any time.

Let N be the length/period of a desired data stream. If the relation below holds:

$$N = i^*n + j^*(n+1) \quad (1)$$

(where i and j are non-negative integers, and at least one of them is non-zero), this data stream can be generated by using n of the parallel arranged banks out of the memory group 13 for i iterations, and using all n+1 of the banks of the memory group 13 for the remaining j times iterations. In other words, this operation is equivalent to one in which the data stream is generated by dynamically switching between the data stream generator shown in FIG. 3 having n banks of memory and that having n+1 banks of memory.

In operation, i+j is equal to the number of address positions existing between the start address and the last address. In addition to the start and the last addresses, the value of i (or j) may be calculated in advance (the manner of the calculation will be described below) and set in an i-counter 107 in FIG. 1. Then, once this apparatus starts its operation, when the contents of the i-counter 107 are not zero, the output from the i-counter 107 sets both the factor of frequency-division of the (1/n, 1/n+1)-frequency divider 101 and the modulus number of the (n, n+1)-counter 105 to n.

The clock signal output by the (1/n, 1/n+1)-frequency divider 101 is applied to the i-counter 107 to decrement its contents, as well as to the address counter 11 and latch group 15. When the contents of the i-counter are decremented to zero, its output signal changes both the factor of frequency division of the (1/n, 1/n+1)-frequency divider 101 and the modulus number of the (n, n+1)-counter 105 from n to n+1.

After that, when the address output by the address counter 11 reaches the last address, the operation may be stopped, or the above operation may be repeated by setting the start address and the value of i respectively to the address counter 11 and the i-counter 107 again to generate the periodic data stream, as required. Alternatively, an additional counter may be provided to stop the operation after the periodic data stream generation is repeated a predetermined number of times.

The length/period of the data stream, N, which can be generated by the above-described configuration can be any natural number equal to or greater than $n^*(n-1)$ (the proof will be given later). Even if N is less than $n^*(n-1)$, a much greater degree of freedom is obtained for choosing N than in the prior art. Hence, a larger selection of length/period data streams can be realized with this configuration.

Though the embodiment shown in FIG. 1 employs the multiplexer 103 to select data held in the latch group 15, the multiplexer is not essential to the invention; what is essential is to select the output of the latches in the manner satisfying the condition described as above.

Figure 1A:
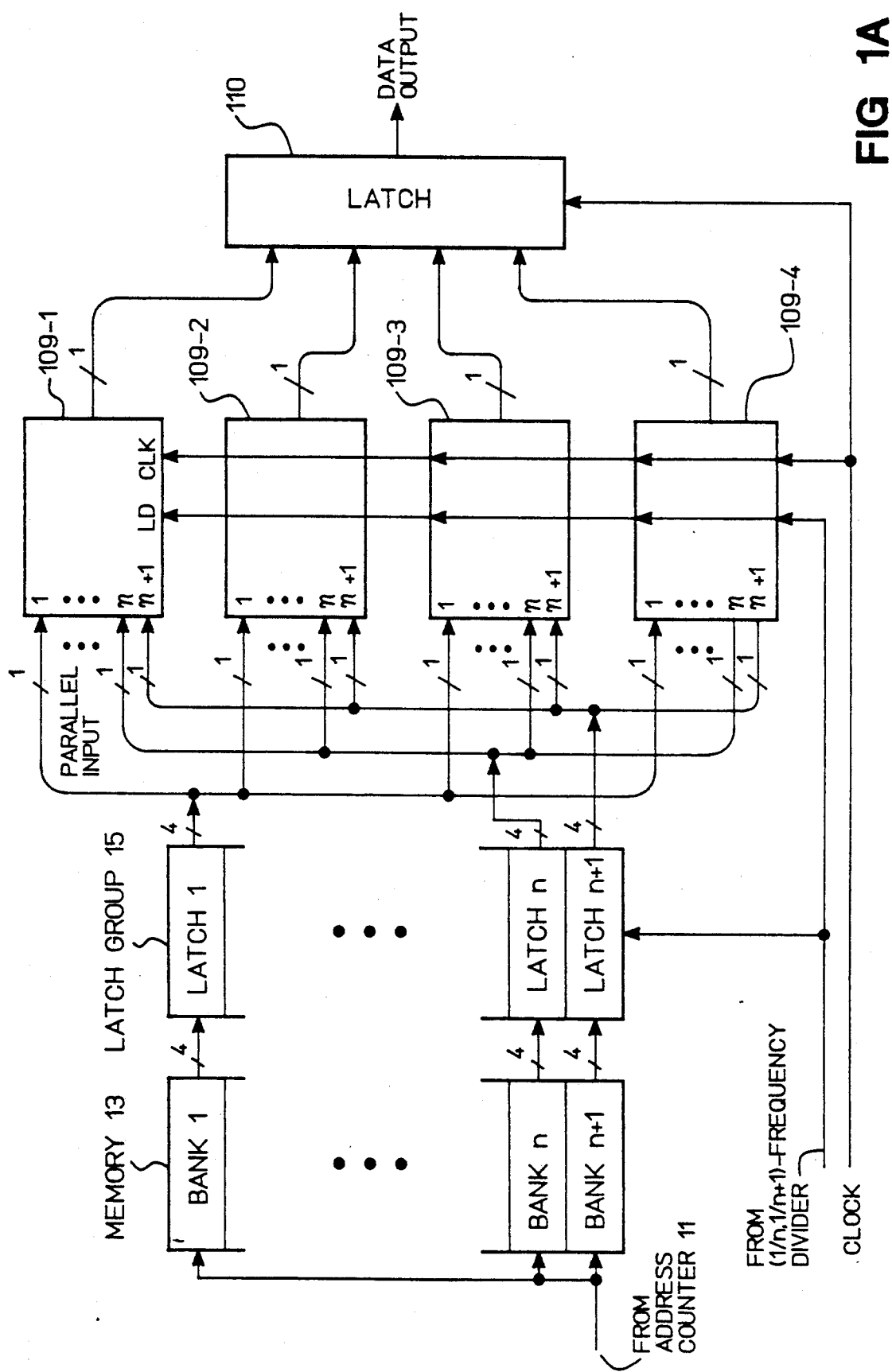
FIGS. 1A and 1B show the block diagrams of the modified versions of the embodiment in FIG. 1.

For example, as shown in FIG. 1A, the data output portion may be constructed with (n+1)-bit shift registers 109-1, 109-2, 109-3, and 109-4, followed by a latch 110. The shift registers 109-1, 109-2, 109-3, and 109-4 are loaded with data from the latch group under control of the signal from the (1/n, 1/+1)-frequency divider, and clocked at the clock frequency $f_{CLK}$. Though FIG. 1 indicates that each bank of the memory 13 is four-bits wide, it is clear that other bit widths may be readily implemented.

Figure 1B:
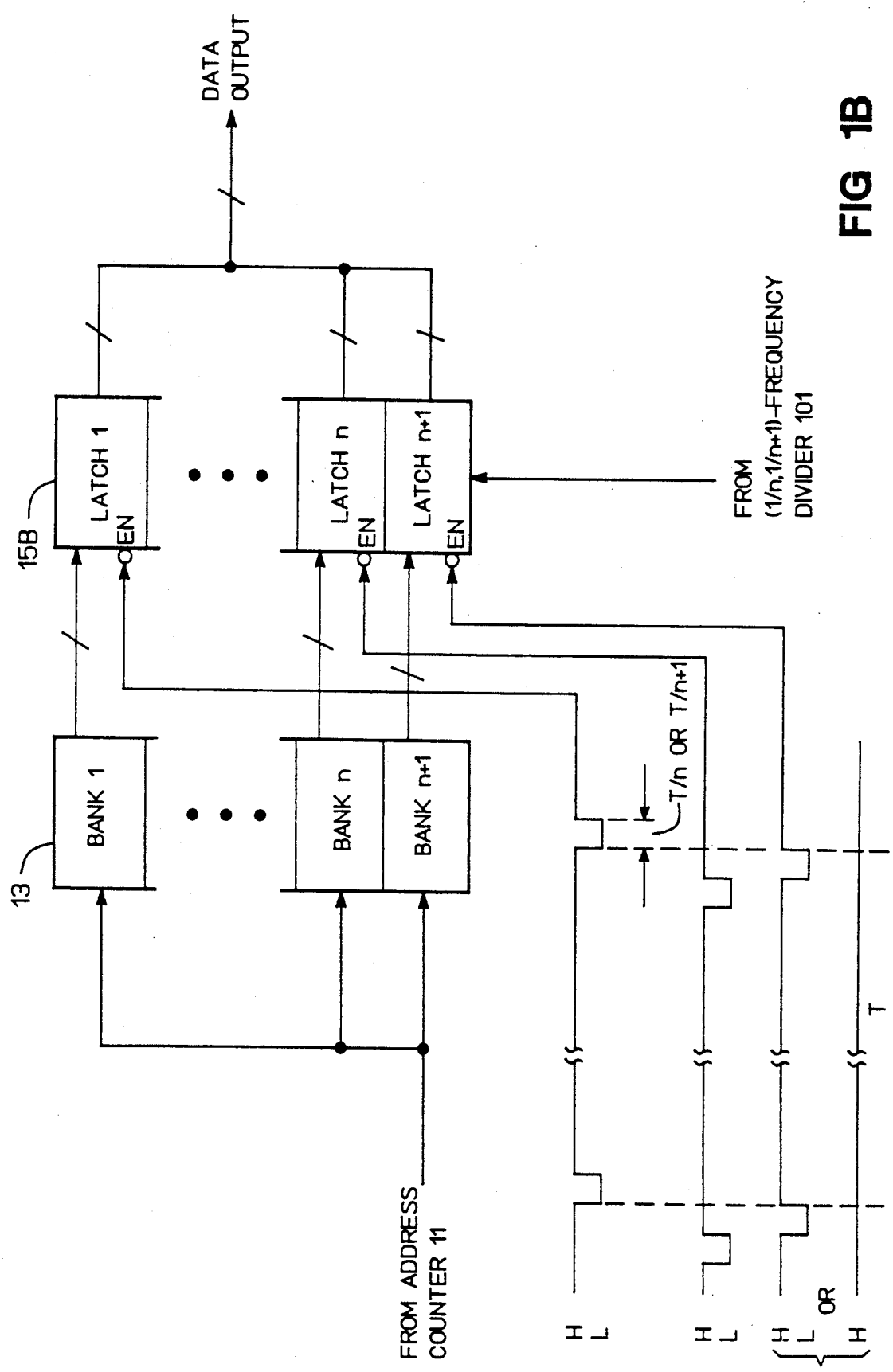

Alternatively, the latch group 15B having tri-state control for their outputs may be employed, as shown in FIG. 1B, instead of the shift registers. The latches in latch group 15B are loaded with data from the banks of memory 13 under control of the signal from the (1/n,1/n+1)-frequency divider, and sequentially enabled, at the clock frequency $f_{CLK}$, by a set of n+1 tri-state control signals as indicated in FIG. 1B.

The method for calculating the value of i for setting the i-counter referred to above will now be explained.

Here, we first show equation (1) again:

$$N = i^*n + j^*(n+1) \quad (1)$$

where i and j are non-negative integers, and at least one of them is non-zero.

Assume that j+0 in equation (1) (i.e., having this apparatus always operate as the data stream generator with n number of banks). Then the maximum number of i, $i_{j=o}$, such that the right-hand side of equation (1) does not exceed N will be:

$$i_{j=o} = [N/n]$$

where [] is Gauss' notation, and thus $$N - i_{j=o}^* n = mod_n N.$$

This is the number of pieces of additional data that will be needed to make the value of the right-hand side of equation (1) equal to N. Note here that if we decrement i by one and increment j by one, the value of the expression of the right-hand side of equation (1) will increase by one as shown below:

$$\{(i-1)^*n + (j+1)^*(n+1)\} - \{i^*n + j^*(n+1)\} = 1$$

This means that, with the incrementing-decrementing procedure described above, we can increase the value of the expression of the right-hand side of equation (1) as far as the result of the decrement of i remains non-negative.

Because $0 \leq mod_n N \geq n-1$ holds, it will easily be understood that, if $I_{j=o}$ is not less than n-1, then the length/period of the data stream generated can be made equal to N by having the apparatus operate as the data stream generator with n+1 number of banks for $mod_n N$ times of iterations out of $i_{j=o}$ times of iterations. This relationship can be used in connection with equation (1), by employing the values:

$$i_{j=o} - \text{mod}_n N = i$$

and $$\text{mod}_n N = j$$

Substituting these values into equation (1) yields:

$$(i_{j=o} - \text{mod}_n N)^* n + \text{mod}_n N^*(n+1) = n^* i_{j=o} + \text{mod}_n N.$$

Since $i_{j=o} = [N/n]$, we obtain:

$$n^*[N/n] + \text{mod}_n N = N.$$

That is, the value of i to be set to the i-counter 107 in order to set the length/period of the data stream to N is:

$$[N/n] - \text{mod}_n N.$$

Furthermore, the explanation above implies that, for a certain natural number, K, such that [K/n] is less than n−1, either i or j must be negative in order for K, i and j to satisfy the relationship of equation (1):

$$K = i^* n + j^*(n+1).$$

Figure 2:
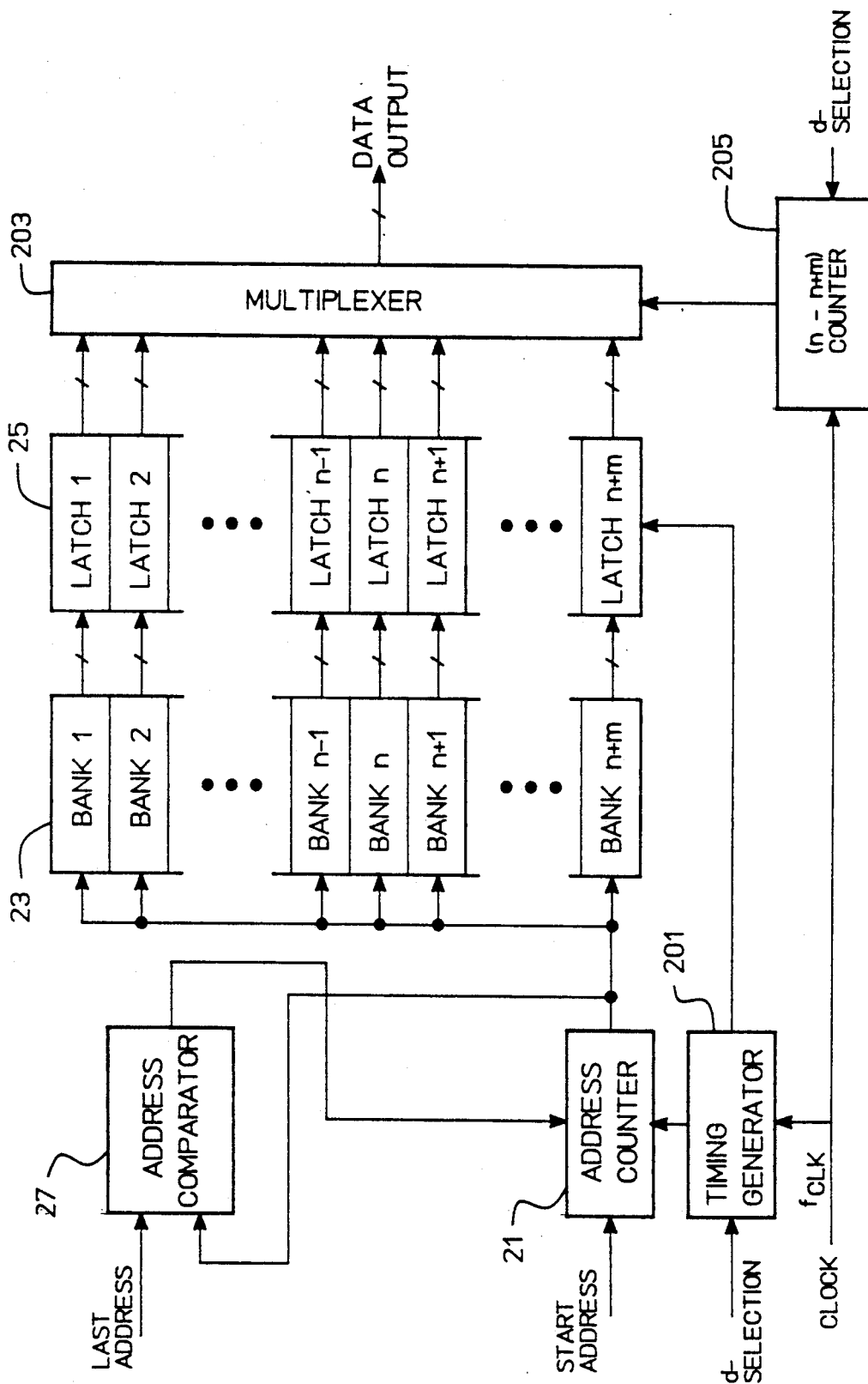
FIG. 2 shows the block diagram of another embodiment of the present invention.

FIG. 2 is a block diagram of another embodiment of the present invention.

Figure 4:
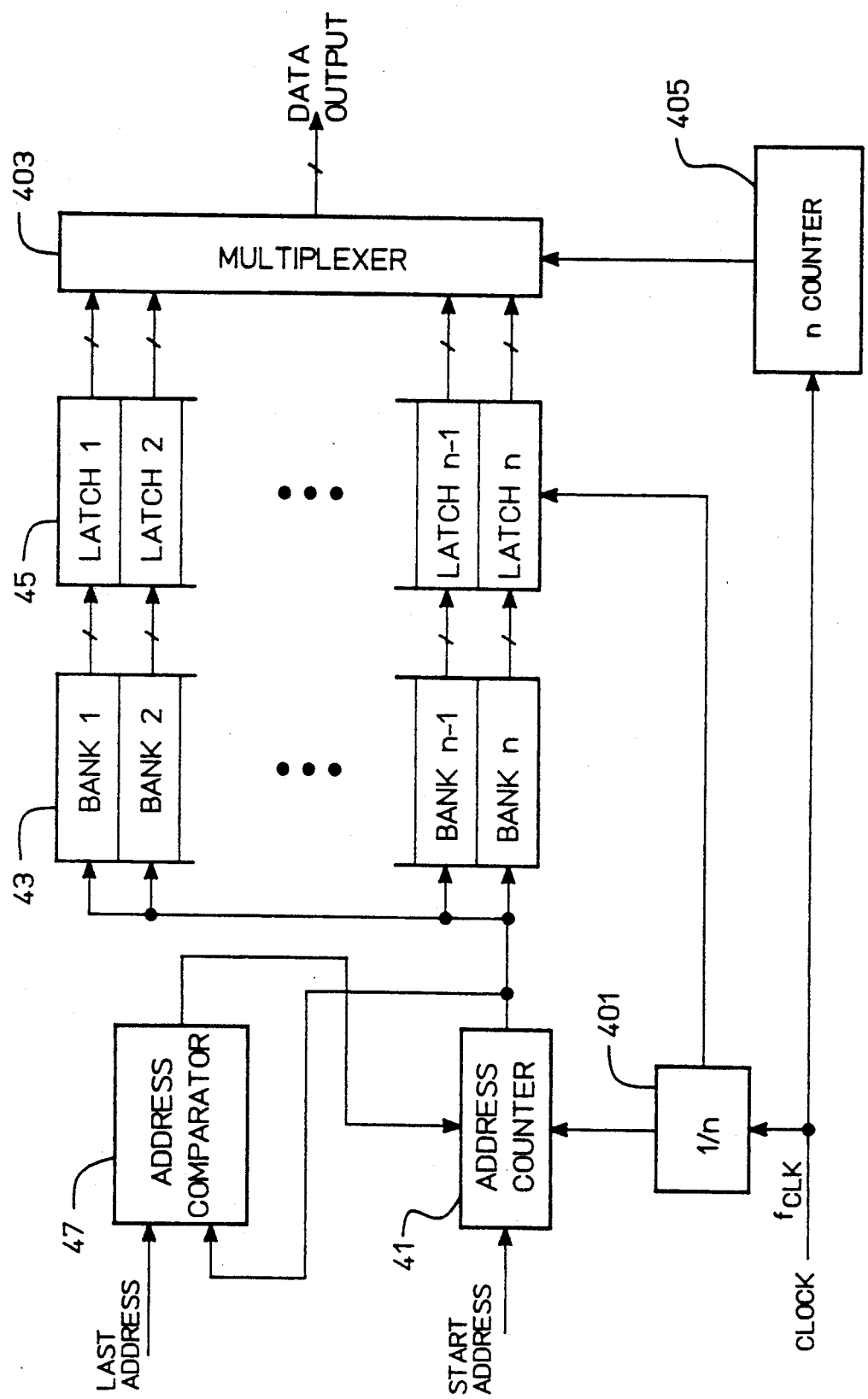

In FIG. 2, the operation of an address comparator 27 and an address counter 21 are the same as their counterparts in FIG. 4. However, memory group 23 has n+m banks. A timing generator 201 divides the clock frequency $f_{CLK}$ by a variable factor d, which can be changed within the range of n through n+m. This factor of frequency-division is set in advance before starting the generation of the data stream. The modulus number of a variable modulus (n to n+m)-counter 205 is set at the same value as the factor of frequency-division, d. The variable modulus (n to n+m)-counter 205 sends a selection signal to a multiplexer 203.

With configuration shown in FIG. 2, the selection of the length or period of the data stream, which was limited to multiples of n in the prior art, can now be made using multiples of n+1, n+2, ..., n+m, in addition to the multiples of n. In other words, if the length or period of the data to be generated has a factor, d, within the range of n through n+m, the factor of frequency-division and the modulus number of the (n−n+m)-counter 205 may be set at d, with any approriate data stored in each of the bank of the memory 23.

There are a wide variety of options for the manner of the operation of the embodiment described above, as referred to in connection with the prior art. The options include stopping the operation, repeating the operation by returning to the start address again when the address in the address counter reaches the last address, or repeatedly generating the data stream stored between the start and the last addresses a predetermined number of times by providing an additional counter.

In addition, the apparatus may use the shift register described in connection with FIG. 1A instead of the multiplexer 203. Furthermore, the n+m latches in latch group 25 may be the tri-state output type, as described in connection with FIG. 1B.

If the timing in the latch group between the data latching and the data reading is critical, another modification may be employed by using a well-known technique. More specifically, in the configurations described so far, all the latches in the latch group latch the pieces of data provided from the associated banks of the memory at the same time. This latching operation should be completed between two consecutive clock pulses, or between the reading out from the last latch (e.g., latch n or n+1 in FIG. 1) and the reading out from the first latch (e.g., latch 1 in FIG. 1). When the data stream generator operates at a very high clock rate, the data might not be settled at the output of the first latch at the time it is read. To avoid this problem, the latches in the latch group may be divided into groups, for example, group 1 comprising latches 1 through m and group 2 comprising latches m+1 through n+1. Group 1 latches the data at any appropriate time after the latch m is read and well before the last latch (the latch n or n+1) is read. Latching by group 2 is done after the last latch is read and well before latch m+1 is read. With this operation, a sufficient time margin is obtained for the data to settle between the data latching and the data reading.

As a specific example, Table 1 below indicates the operation speeds and the limitations on the lengths/periods of the data streams when operating the data stream generators shown in FIGS. 1 through 4 with n=4 and m=3, using memory with 35nS access time.

TABLE 1

Figure 3:
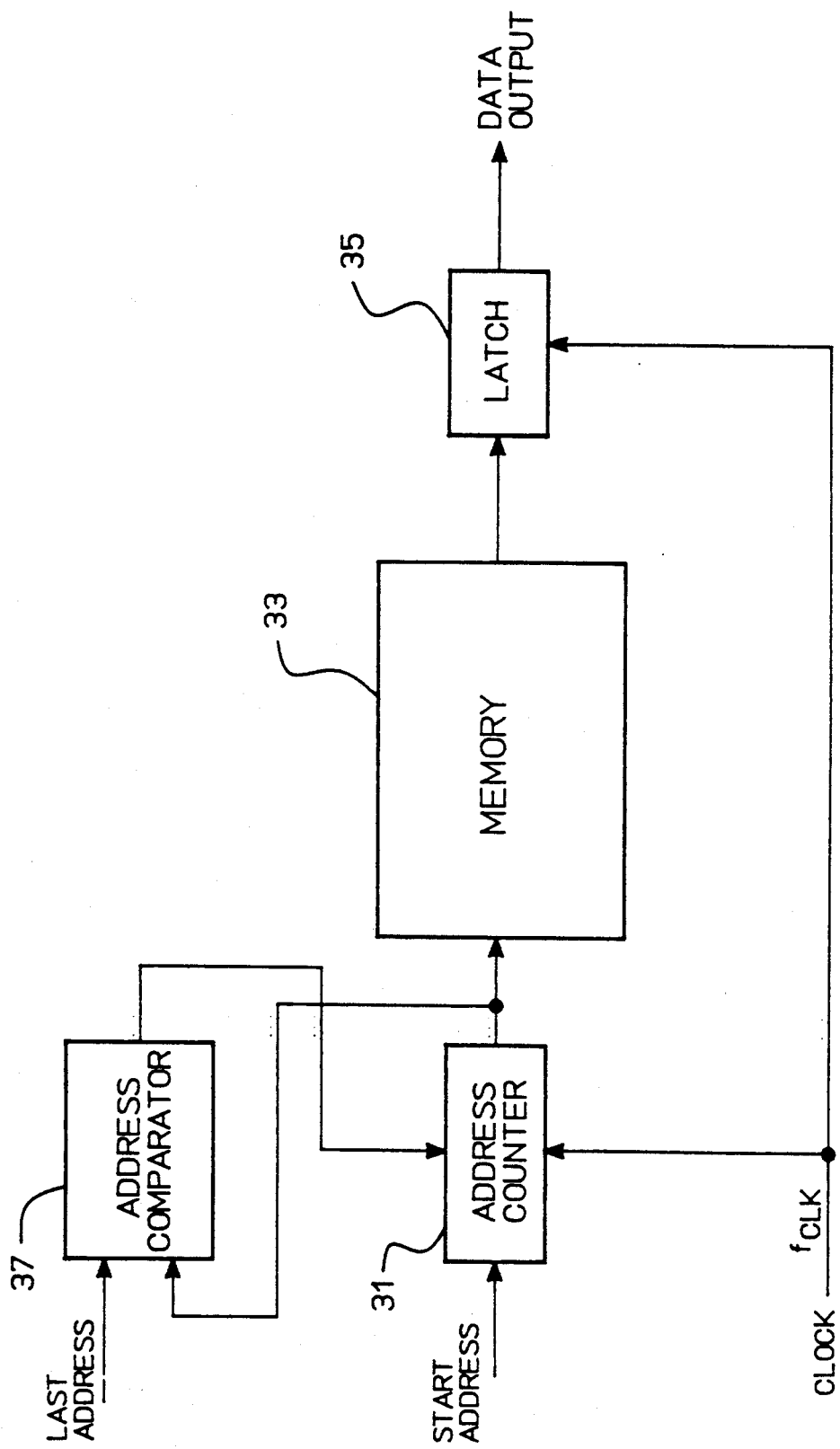
FIGS. 3 and 4 show the block diagrams of the prior art.

| operating speed (MHz) | configuration | | | |
|---|---|---|---|---|
| | FIG. 1 144 (1/35nS*4) | FIG. 2 144 | FIG. 3 28 (1/35nS) | FIG. 4 144 |
| length/period of data stream available | | | | 1 |
| | | | | 2 |
| | | | | 3 |
| | 4 | 4 | 4 | 4 |
| | 5 | 5 | 5 | |
| | | | 6 | 6 |
| | 8 | 8 | 8 | 8 |
| | 9 | | 9 | |
| | 10 | 10 | 10 | |
| | | | 11 | |
| | 12 | 12 | 12 | 12 |
| | 13 | | 13 | |
| | 14 | 14 | 14 | |
| | 15 | | 15 | |
| | 16 | 16 | 16 | 16 |
| | 17 | | 17 | |
| | 18 | 18 | 18 | |
| | 19 | | 19 | |
| | 20 | 20 | 20 | 20 |
| | 21 | | 21 | |
| | etc. | | | |

As the description and the table illustrate, in accordance with the present invention, a data stream with a high degree of freedom in choosing the length/period can be generated at high speed, even with a relatively slow memory.

What is claimed is:

1. An apparatus for generating a data stream comprising:

clock means for providing a clock signal;

address generating means coupled to said clock means for generating a sequence of addresses, said address generating means comprising address counter means, stepping in response to a frequency divided clock signal, for generation said sequence of addresses, and means for setting said address counter means to a start address;

memory means responsive to said addresses, from which a plurality of words of data associated with each of said addresses are read in response to each of said addresses, said memory means comprises n+1 memory bank means, each memory bank means having an output from which data is read; and output means for sequentially outputting said plurality of words of data that is read from said memory means before the data associated with the next said address is read from said memory, said output means comprising a plurality of n+1 latches each of said latches connected to an associated one of said memory bank means for latching said plurality of words read from said memory means, and selection means coupled to said plurality of latch means for sequentially selecting each of said plurality of latch means in response to a selection signal and for sequentially outputting a word from the latch means selected based on said selection signal;

control means coupled to said clock means, said control means performing control in synchronism with said clock signal such that said output means outputs only a portion of said plurality of words of data, said control means comprising frequency dividing means for dividing said clock signal by said switchable factor to produce a frequency divided clock signal, first counter means for generating said selection signal in response to said clock signal, said first counter means counting by a switchable modulus number, and second counter means stepping in response to said frequency divided clock signal, to produce a switching control output;

said first counter means responsive to said switching control output for switching its modulus number between n and n+1 when said switching control output reaches a predetermined number; and said frequency dividing means responsive to said switching control output for switching its factor of frequency division between n and n+1 when said switching control output reaches said predetermined number.

2. The apparatus for generating a data stream as in claim 1, wherein said address generating means further comprises an address comparator means for comparing said addresses generated by said address counter means with a predetermined last address.

3. The apparatus for generating a data stream as in claim 2, wherein said apparatus stops its operation when said address comparator means detects that said address generated by said address counter means and said predetermined last address coincide.

4. The apparatus for generating a data stream as in claim 2, wherein said apparatus repeats its operation by setting said address counter means to said start address when said address comparator means detects that said address generated by said address counter means and said predetermined last address coincide.

5. The apparatus for generating a data stream as in claim 4, further comprising a third counter means for counting the number of repetitions of operation of said apparatus for generation of said data stream, for stopping said repetition when said number of repetitions reaches a predetermined repeat count.

6. An apparatus for generating a data stream comprising:

clock means for providing a clock signal;

address generating means coupled to said clock means for generating a sequence of addresses, said address generating means comprising address counter means, stepping in response to a frequency divided clock signal, for generating said sequence of addresses, and means for setting said address counter means to a start address;

memory means responsive to said addresses, from which a plurality of words of data associated with each of said addresses are read in response to each of said addresses, said memory means comprises n+m memory bank means, each memory bank means having an output from which data is read; and output means for sequentially outputting said plurality of words of data that is read from said memory means before the data associated with the next said address is read from said memory, said output means comprising a plurality of n+m latches each of said latches connected to an associated one of said memory bank means for latching said plurality of words read from said memory means, and selection means coupled to said plurality of latch means for sequentially selecting each of said plurality of latch means in response to a selection signal and for sequentially outputting a word from the latch means selected based on said selection signal;

control means coupled to said clock means, said control means performing control in synchronism with said clock signal such that said output means outputs only a portion of said plurality of words of data, said control means comprising frequency dividing means for dividing said clock signal by a switchable factor selected from the range from n to n+m to produce said frequency divided clock signal, first counter means for generating said selection signal in response to said clock signal, said first counter means counting by a switchable modulus number selected from the range from n through n+m; and second counter means stepping in response to said frequency divided clock signal, to produce a switching control output;

wherein said factor of frequency division of said frequency dividing means and said modulus number of said first counter means are set at the same number during generation of one data stream.

7. The apparatus for generating a data stream as in claim 6, wherein said address generating means further comprises an address comparator means for comparing said addresses generated by said address counter means with a predetermined last address.

8. The apparatus for generating a data stream as in claim 7, wherein said apparatus stops its operation when said address comparator means detects that said address generated by said address counter means and said predetermined last address coincide.

9. The apparatus for generating a data stream as in claim 7, wherein said apparatus repeats its operation by setting said address counter means to said start address when said address comparator means detects that said address generated by said address counter means and said predetermined last address coincide.

10. The apparatus for generating a data stream as in claim 9, further comprising a third counter means for counting the number of repetitions of operation of said apparatus for generation of said data stream, for stopping said repetition when said number of repetitions reaches a predetermined repeat count.

* * * * *